United States Patent
Yamashita et al.

(10) Patent No.: US 7,285,338 B2
(45) Date of Patent: Oct. 23, 2007

(54) ANISOTROPIC THIN-FILM RARE-EARTH PERMANENT MAGNET

(75) Inventors: Osamu Yamashita, Ibaraki (JP); Ken Makita, Osaka (JP)

(73) Assignee: Neomax Co., Ltd., Osaka (JP)

( * ) Notice: Subject to any disclaimer, the term of this patent is extended or adjusted under 35 U.S.C. 154(b) by 0 days.

(21) Appl. No.: 10/343,480

(22) PCT Filed: Jul. 30, 2001

(86) PCT No.: PCT/JP01/06562

§ 371 (c)(1),
(2), (4) Date: May 21, 2003

(87) PCT Pub. No.: WO02/15206

PCT Pub. Date: Feb. 21, 2002

(65) Prior Publication Data

US 2004/0091745 A1    May 13, 2004

(30) Foreign Application Priority Data

Aug. 2, 2000   (JP) .............................. 2000-233936

(51) Int. Cl.
*B32B 7/02*    (2006.01)
*B32B 15/01*   (2006.01)
*B32B 15/04*   (2006.01)

(52) U.S. Cl. ...................... 428/668; 428/669; 428/670; 428/678; 428/679; 428/216; 428/819.1; 428/819.4; 428/828.1; 428/692.1; 428/693.1

(58) Field of Classification Search ................ 428/611, 428/636, 637, 656, 668, 678, 679, 681, 141, 428/694 RE, 694 MM, 819.1; 369/13.45
See application file for complete search history.

(56) References Cited

U.S. PATENT DOCUMENTS 4,058,430 A * 11/1977 Suntola et al. .......... 427/255.13

(Continued)

FOREIGN PATENT DOCUMENTS

JP          61-108112          5/1986

(Continued)

OTHER PUBLICATIONS

Derwent Abstract Translation of JP 01-168858-A (Derwent Acc. No. 1990-181137).*

(Continued)

*Primary Examiner*—Kevin M. Bernatz
(74) *Attorney, Agent, or Firm*—Darby & Darby

(57) ABSTRACT

An anisotropic thin-film rare-earth permanent magnet endowed with high magnetic characteristics by rendering a vapor-phase-grown thin film anisotropic in the layering direction. The atomic laminate units are formed by laminating a monoatomic layer of a rare earth element on a substrate of a non-magnetic material having, a flat smoothness and then by laminating an atomic laminate of a transition metal element having a plurality of monoatomic layers of a transition metal element, so that the atomic laminate units of a characteristic construction are laminated in a plurality of layers. As a result, each atomic laminate of the transition metal element has an easy magnetizable axis in the laminate direction of the monoatomic layers and which are sandwiched between a monoatomic layer of a rare-earth element so that an inverse magnetic domain is suppressed to establish a strong coercive force. Moreover, the content of the transition metal element to the rare-earth metal is raised to improve the residual magnetic flux density drastically.

16 Claims, 1 Drawing Sheet

U.S. PATENT DOCUMENTS

| | | | | |
|---|---|---|---|---|
| 4,727,005 | A | * | 2/1988 | Sato ............................ 428/693 |
| 4,876,159 | A | * | 10/1989 | Shin ............................ 428/607 |
| 4,929,320 | A | * | 5/1990 | Yamada et al. .......... 204/192.2 |
| 5,441,804 | A | * | 8/1995 | Akitake et al. ............. 428/336 |
| 5,536,589 | A | * | 7/1996 | Nakamura et al. ....... 428/819.1 |
| 5,858,565 | A | * | 1/1999 | Victora et al. ........... 428/819.1 |
| 6,010,780 | A | * | 1/2000 | Nakayama et al. ......... 428/332 |
| 6,346,309 | B1 | * | 2/2002 | Daimon ..................... 428/64.1 |
| 2002/0028740 | A1 | * | 3/2002 | Zou et al. ...................... 501/9 |

FOREIGN PATENT DOCUMENTS

| | | | |
|---|---|---|---|
| JP | 61-30017 A | | 12/1986 |
| JP | 01-168858 A | * | 7/1989 |
| JP | 6-151226 | | 5/1994 |
| JP | 8-195314 A | | 7/1996 |

OTHER PUBLICATIONS

English Translation of JP 01-168858-A (PTO 04-3864).*

Yamashita et al., Film magnet production for recording media-by alternately laminating metal and alloy layers each of specified anisotropy thickness, Japan Patent 6-151226, May 31, 1994, Japan.

Tanaka et al., Vertically magnetisable recording medium—has alternating layers of at least one rare earth metal and at least one transition metal., Japan Patent 61-108112, May 26, 1986, Japan.

* cited by examiner

A

B

ANISOTROPIC THIN-FILM RARE-EARTH PERMANENT MAGNET

This is a U.S. national phase application under 35 U.S.C. 371 of International Patent Application No. PCT/JP01/06562, filed Jul. 30, 2001, and claims the benefit of Japanese Patent Application No. 2000-233936, filed Aug. 2, 2000. The International Application was published iii Japanese on Feb. 21, 2002 as WO 02/15206 A1 under PCT Article 21(2).

TECHNICAL FIELD

The present invention relates to a thin-film rare-earth permanent magnet, and more particularly to a thin-film rare-earth permanent magnet whose structure has one or more atomic layered units in which a monoatomic layer of a rare-earth element is formed on a substrate of a nonmagnetic material with excellent surface hardness and flatness, such as a single-crystal silicon wafer, and in which a plurality of monoatomic layers of a transition metal element are then layered to produce a thin-film magnet that has high magnetic characteristics and possesses an axis of easy magnetization in the layering direction; and to a manufacturing method thereof.

BACKGROUND ART

In conventional practice, thin-film rare-earth permanent magnets are primarily obtained by the layering of materials based on Nd Fe B by vacuum vapor deposition or sputtering. The crystal structures of the layered formations obtained by these methods are disadvantageous in that the axis of easy magnetization is random, isotropic permanent magnet characteristics alone can be obtained in terms of magnetic characteristics, and only magnetic characteristics that are vastly inferior to those of anisotropic sintered permanent magnets can be obtained.

A method in which transition metal layers and magnet layers based on Nd Fe B are repeatedly layered in a specific thickness is described in Japanese Patent Application Laid-open No. H6-151226 as a means of improving magnetic characteristics. This method is disadvantageous in that the c axis, which is the axis of easy magnetization in Nd Fe B, is very difficult to completely align in the layering direction because the growth direction varies with the crystal direction of the underlying transition metal layers.

Another proposal concerns a vertically magnetized film in which a total of at least two layers is obtained by the alternate layering of at least one rare-earth metal film selected from Gd, Tb, and Dy, and of at least one transition metal film selected from Fe, Co, Ni, Cr, and Cu (Japanese Patent Application Laid-open No. S61 108112).

The magnetic characteristics are improved by layering transition metal films and rare-earth metal films on a vertically magnetized film in the order indicated. However, the use of a vertically magnetized film as the magnetic medium is presupposed, thus resulting in a very weak coercive force (about 1 kOe) and making it impossible to use the product as a permanent magnet.

In conventional practice, various proposals have been made concerning techniques for manufacturing thin-film permanent magnets by sputtering, vapor deposition, ion plating, and other techniques, but the magnets produced by all these methods had vastly inferior magnetic characteristics in comparison with anisotropic sintered permanent magnets.

DISCLOSURE OF THE INVENTION

An object of the present invention is to provide an anisotropic thin-film rare-earth permanent magnet endowed with high magnetic characteristics by rendering a vapor-phase-grown thin film anisotropic in the layering direction.

As a result of extensive research into the high magnet characteristics of thin-film rare-earth permanent magnets, the inventors discovered that the residual magnetic flux density can be markedly increased by layering one or a plurality of atomic layered units in which a monoatomic layer based on a rare-earth element is layered on a substrate of a nonmagnetic material, and a plurality of monoatomic layers of a transition metal element are then layered, whereby each unit has an axis of easy magnetization in the layering direction, and the percentage content of the transition metal element in relation to the rare-earth element is increased.

In addition, the inventors perfected the present invention upon discovering that the formation of reverse magnetic domains can be controlled and oxidation prevented, that a heat treatment can be conducted, particularly at a temperature of 900 K or less, that magnetic characteristics, and coercive force in particular, can be markedly improved by the heat treatment, and that a thin-film rare-earth permanent magnet having excellent magnetic characteristics can be produced by forming one or more monoatomic layers of a rare-earth element on the uppermost monoatomic layer of a transition metal element after the layering of the atomic layered units has been completed.

Specifically, the present invention resides in a thin-film rare-earth permanent magnet characterized in having one or more atomic layered units in which a plurality of monoatomic layers of a transition metal element are layered on a monoatomic layer of a rare-earth element on a substrate comprising a nonmagnetic material whose surface roughness (arithmetic mean roughness Ra) is 1.0 μm or less, and having one or more monoatomic layers of the rare-earth element on the uppermost monoatomic layer of the transition metal element.

The inventors also proposed, as the structures for the aforementioned thin-film rare-earth permanent magnet, a structure in which the substrate comprising a nonmagnetic material is a single-crystal silicon wafer or a wafer having an $RB_2C_2$ (where R is a rare-earth element) cleavage plane;

a structure in which the rare-earth element is at least one element selected from Nd, Tb, and Dy, and the transition metal element is at least one element selected from Ti, V, Cr, Mn, Fe, Co, Ni, and Cu; and a structure in which a protective film is formed on the entire layered formation.

The inventors further proposed a method for manufacturing a thin-film rare-earth permanent magnet characterized in comprising step A for forming a monoatomic layer of a rare-earth element on a substrate comprising a nonmagnetic material, step B for repeating a plurality of times steps for forming monoatomic layers of a transition metal element on the monoatomic layer of the rare-earth element, a step for repeating one or more times steps A and B, a step for forming one or more monoatomic layers of the rare-earth element on the uppermost monoatomic layer of the transition metal element, and an optional step for heat-treating the thin-film rare-earth permanent magnet at 600 K to 900 K in a vacuum or an inert gas atmosphere.

BRIEF DESCRIPTION OF THE DRAWINGS

FIG. 1 is a diagram depicting the structure of the thin-film rare-earth permanent magnet in accordance with the present invention, wherein FIG. 1A depicts the atomic layered unit, and FIG. 1B depicts the structure obtained by layering a plurality of such atomic layered units.

BEST MODE FOR CARRYING OUT THE INVENTION

Figure 1:
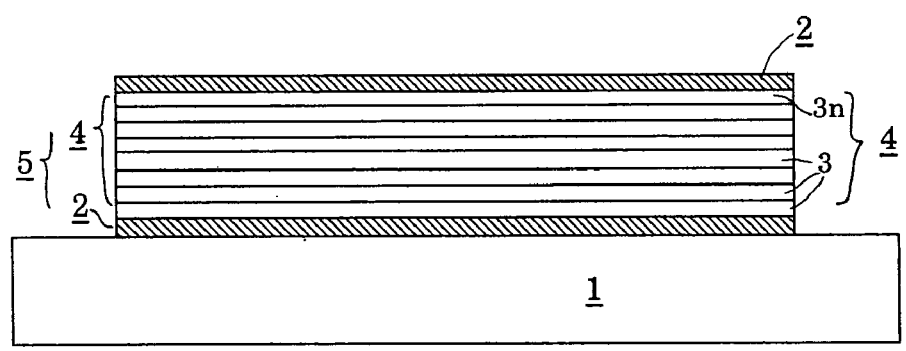
Figure 1:
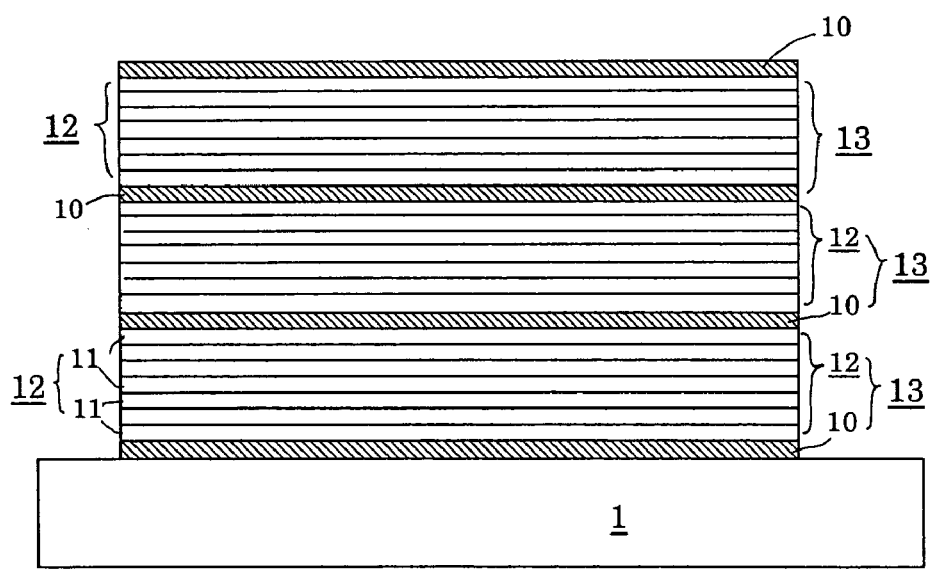

The method discovered by the inventors and aimed at rendering thin films that comprise a rare-earth element and a transition metal element anisotropic in the layering direction to improve the magnetic characteristics of a thin-film rare-earth permanent magnet was perfected as a result of the following course of reasoning. The description that follows is given with reference to a case in which Nd is used as the rare-earth element, and Fe as the transition metal element.

In conventional practice, the magnetic anisotropy of known permanent magnets based on Nd Fe B is produced by the magnetic anisotropy of the Nd atoms of 4f sites and 4g sites. In the $Nd_2Fe_{14}B$ crystal structure, which constitutes the principle phase of the magnet, the nearest neighbor atoms to the 4f sites of Nd comprise two of Nd, two of B, and two of Fe; the nearest neighbor atoms to the 4g sites of Nd comprise three of Nd, one of B, and two of Fe; although the electric charge sign of Fe is unknown, at least one of Nd and B has a positive electric charge.

The wave function of the unpaired $4f$ electrons of Nd has a bun-shaped (oblate, spheroid) broadening, and the magnetic moments due to orbital angular momentum are perpendicular to the broadening of the wave function, so the wave function with the oblate broadening is affected and caused to spread in the c plane by the crystalline field created by the surrounding ions, and considerable magnetic anisotropy is created along the c axis. The inventors suggested that the characteristics of a thin-film rare-earth permanent magnet can be enhanced by applying this principle of magnetic anisotropy to a thin-film rare-earth magnet. Specifically, a monoatomic layer 2 of Nd, which is a rare-earth element, is formed on a substrate 1 of a nonmagnetic material (see FIG. 1A). When the Nd atoms are aligned in the same plane, the magnetic moments due to the 4f electrons of Nd have axes of easy magnetization in the direction perpendicular to the plane in the same manner as those of $Nd_2 Fe_{14}B$, but nothing definite can be concluded at this stage because the actual magnetic structure of the magnetic moments is determined by the interaction of the magnetic moments.

In this arrangement, providing the monoatomic Nd layer 2 with an atomic Fe layered formation 4 obtained by layering several monoatomic Fe layers 3 allows the magnetic moment of Nd to be aligned parallel to the magnetic moment of Fe by the strong ferromagnetic interaction between Fe Fe and Fe Nd. In this state, however, the coercive force is weak and a permanent magnet is impossible to obtain because the magnetic moment of the uppermost monoatomic layer 3n merely creates reverse magnetic domains in the weak magnetic field.

When another monoatomic Nd layer 2 is subsequently formed on the uppermost monoatomic Fe layer 3n, the formation of the reverse magnetic domains is controlled, a strong coercive force is produced, and a layered structure identical to the crystal structure of $Nd_2Fe_{14}B$ is created, yielding a strong permanent magnet.

The atomic layered unit 5 obtained by forming an atomic Fe layered formation 4 on a monoatomic Nd layer 2 is used as a base, and this atomic layered unit 5 is repeatedly formed. Specifically, a thin-film rare-earth permanent magnet with better magnetic characteristics can be obtained by repeatedly providing the monoatomic Nd layer 2 with an atomic Fe layered formation 4 obtained by layering several monoatomic Fe layers 3.

The thin-film rare-earth permanent magnet is configured by using as a base an atomic layered unit 5 comprising monoatomic Nd layers 2 and an atomic Fe layered formation 4 obtained by layering a plurality of monoatomic Fe layers 3 thereon, and forming one or a plurality of such bases on the substrate 1.

To summarize, the present invention was perfected as a result of the discovery that the residual magnetic flux density can be markedly increased and high magnetic characteristics achieved in the above-described structure of an atomic layered unit by inducing ferromagnetic interaction between Fe Fe and Fe Nd, that is, by ensuring that the atomic Fe layered formation 4 is provided with an axis of easy magnetization in the layering direction of the monoatomic layers 3 and is sandwiched between the monoatomic Nd layers 2, 2 to control the formation of reverse magnetic domains and to obtain high magnetic characteristics.

In the above-described atomic layered unit, the rare-earth element must form monoatomic layers, and the transition metal element must be layered as a plurality of such monoatomic layers. The formation of reverse magnetic domains can be controlled and oxidation prevented by forming one or more monoatomic layers of the rare-earth element on the uppermost monoatomic layer of the transition metal element in the unit, a heat treatment can be conducted at a temperature of 900 K or less in a vacuum or an inorganic gas atmosphere, and the coercive force can be further increased. In the present invention, the rare-earth element is preferably at least one element selected from Nd, Tb, and Dy, and the transition metal element is preferably at least one element selected from Ti, V, Cr, Mn, Fe, Co, Ni, and Cu. The material used is an ingot of a rare-earth element and a transition metal element with a purity of 99% or greater. Particularly, the oxygen content and carbon content should be 0.05 wt % or less and 0.01 wt % or less, respectively. The coercive force decreases dramatically when these oxygen and carbon elements are contained.

In the present invention, sputtering, vapor deposition, ion plating, molecular beam epitaxy (MBE), an ion plasma technique, or the like may be used as the method for forming thin films in an apparatus for forming thin films. Molecular beam epitaxy (MBE) and ion plasma techniques are excellent for layering extremely thin films, such as monoatomic layers or monoatomic layered formations that comprise a plurality of monoatomic layers.

A nonmagnetic material having excellent plane smoothness is preferred for the substrate. The surface roughness of the substrate, defined as arithmetic mean roughness Ra in accordance with JIS B 0601 or ISO 468, should be 1.0 µm or less, preferably 0.5 µm or less, and more preferably 0.1 µm or less. Although higher flatness is desirable for the substrate, no particular limitations are imposed in this respect because the definition varies with the measured surface area of the substrate.

Commercially, a single-crystal Si wafer for manufacturing a semiconductor device has exceptional surface roughness and flatness. For example, a 200 mm single-crystal Si wafer that corresponds to the standards of the Japan Electronic Industry Development Association (JAIDA) has a TTV of 0.8 µm or less, an LTV of 0.5 µm or less, an Ra of 0.1 µm or less, and flatness SFQR (max) of about 0.2 µm or less/25×25 mm. Such wafers may be used.

Specifically, the magnet of the present invention is described above as being provided with an atomic Fe layered formation that has an axis of easy magnetization in the layering direction of the monoatomic layers and is sandwiched between monoatomic Nd layers to control the formation of reverse magnetic domains and to produce a strong coercive force, and is thus characterized in that the atom layers of a transition metal element and the atom layers of a rare-earth element are aligned in the bonding interface. Because the coercive force decreases when these are randomly mixed, the surface roughness and flatness of the substrate have particular importance.

In addition to the aforementioned single-crystal Si wafers with exceptional surface roughness, flatness, and crystallinity, polycrystalline silicon wafers or cleavage planes of $RB_2C_2$ (where R is a rare-earth element) in which the rare-earth element is arranged within the same plane in the crystal are also preferred for the substrate. The $RB_2C_2$ applications are characterized by simple cleavage along the B C planes and rare-earth atom planes.

The layering sequence will now be described. A monoatomic layer 10 of a rare-earth element is first formed on a substrate 1, and an atomic layered formation 12 obtained by layering a plurality of monoatomic layers 11 of a transition metal element is then produced, as shown n FIG. 1B.

An atomic layered formation 13 comprising the monoatomic layer 10 of a rare-earth element and the layered formation 12 of monoatomic layers 11 of the transition metal element is then used as a single unit, and the operations involved in layering a plurality of such units are repeated. In FIG. 1B, three such units are formed, one or more monoatomic layers 14 of a rare-earth element are provided to the uppermost monoatomic layer 11 of the transition metal element, and a thin-film rare-earth permanent magnet measuring from several hundred angstroms to several micrometers is finally produced.

In the aforementioned structure, it is important that the rare-earth element (excluding the uppermost layer) form monoatomic layers and that the transition metal element be layered into a plurality of monoatomic layers. High magnetic characteristics cannot be obtained when, for example, the rare-earth element is layered as a plurality of monoatomic layers, and the transition metal element forms solely monoatomic layers.

In the aforementioned structure, a step in which steps for forming monoatomic layers is repeated a plurality of times should be conducted in order to layer a plurality of monoatomic layers of a transition metal element. Specifically, the defects in each monoatomic layer can be further reduced and the coercive force enhanced by repeatedly layering the film that constitutes each monoatomic layer a plurality of times while repeatedly starting and stopping the film-forming operation, rather than performing layering by forming films in a continuous manner. It is apparent that the layering can also be accomplished by selecting the appropriate conditions and forming films in a continuous manner.

In the present invention, the residual magnetic flux density of the atomic layered unit is primarily determined by the percentage content (Nd:Fe=1:X) of the transition metal element (for example, Fe) in relation to the rare-earth element (for example, Nd). For example, the density becomes greater than that of R2Fe14B, which is the primary phase of a sintered magnet based on R Fe B, if the ratio X exceeds 7. In addition, the residual magnetic flux density varies with the number of layers in the atomic layered unit due to the effect of the demagnetizing field. Consequently, the optimum percentage and the number of layers in the unit should be appropriately selected in order to obtain high magnetic characteristics.

In the present invention, the film obtained by layering a large number of monoatomic layers tends to develop point defects and lattice strain in the joints, and when these are left over, they cause a reduction in coercive force, and the magnetic characteristics are markedly reduced.

In view of this, the coercive force is enhanced and the magnetic characteristics are markedly improved by heat-treating the atomic layered unit in a vacuum or an inert gas atmosphere to remove the defects or strain. The temperature of the heat treatment varies with the composition or film thickness and should preferably be 600 K to 900 K. Successfully performing the heat treatment for a long time at a low temperature can control the interdiffusion between the rare-earth element and transition metal element, and ultimately tends to produce a material with high magnetic characteristics. Interdiffusion is apt to occur between the rare-earth element and transition metal element if the heat treatment temperature exceeds 900 K, and the strain or defects are inadequately corrected, and improved magnetic characteristics are impossible to obtain, if the heat treatment temperature is less than 600 K.

In the thin-film rare-earth permanent magnet pertaining to the present invention, the surface is covered with a rare-earth element in order to prevent oxidation, and a surface treatment for forming a protective film on the surface should preferably be performed in order to further prevent oxidation in the atmosphere. The protective film can be a resin film in addition to the hereinbelow described metal film with excellent strength and corrosion resistance. A polyimide film or the like can be adopted.

Al coating based on vapor-phase growth, Ni plating based on known conventional techniques, and the like should preferably be used for the surface treatment. The protective film should also be a relatively thin film in order to prevent any reduction in volume magnetic characteristics. Whether the surface treatment is performed before the final product is processed or following such processing should be selected in accordance with the product shape and application.

EXAMPLES

Example 1

The Nd and Fe ingot shown in Table 1 was used as the starting material. A 200 mm silicon wafer for commercial integrated circuits (product that corresponded to the standards of the Japan Electronic Industry Development Association (JAIDA)) was used as the single-crystal Si wafer (substrate material), and a sputtering apparatus was used to perform sputtering and to alternately layer monoatomic Nd layers and atomic layered units obtained by layering a plurality of monoatomic Fe layers, yielding thin-film rare-earth permanent magnets in which a monoatomic Nd layer was the uppermost layer.

Table 2 lists the film thicknesses and number of layers in the resulting thin-film rare-earth permanent magnets. Some of the layered films thus obtained were heat-treated in a vacuum at the temperatures shown in Table 2, and the magnetic characteristics thereof were measured by a vibrating sample magnetometer The results are shown in Table 2.

Comparison 1

The starting material shown in Table 1 was used to produce a molten Nd Fe B ingot whose composition is shown in Table 3. The ingot was used as a target, and thin Nd Fe B films whose thicknesses are shown in Table 4 were formed on a Si wafer substrate with the aid of the sputtering apparatus of Example 1. The magnetic characteristics of the resulting thin films were measured by the same apparatus as in the example. The results are shown in Table 4.

Note that Examples $C_2$—$C_5$ are comparative examples.

TABLE 1

| Starting material used | Purity (%) |
|---|---|
| Nd | 99.8 |
| Fe | 99.9 |
| B | 99.9 |

TABLE 2

| | Film thickness (Å) | | Number of layers (Nd-Fe) | Heat treatment temperature (K) | Magnetic characteristics | | |
|---|---|---|---|---|---|---|---|
| No. | Nd | Fe | | | Br (T) | iHc (MA/m) | (BH) max (kJ/m³) |
| 1 | 3 | 10 | 100 | — | 1.02 | 0.55 | 121 |
| 2 | 3 | 15 | 100 | — | 1.36 | 0.89 | 304 |
| 3 | 3 | 15 | 100 | 500 | 1.36 | 0.85 | 293 |
| 4 | 3 | 15 | 100 | 700 | 1.38 | 1.23 | 325 |
| 5 | 3 | 15 | 100 | 900 | 1.36 | 1.20 | 322 |
| C1 | 6 | 10 | 100 | — | 0.95 | 0.65 | 134 |
| C2 | 6 | 15 | 100 | — | 1.26 | 1.15 | 295 |
| C3 | 6 | 15 | 100 | 700 | 1.29 | 1.35 | 304 |

TABLE 3

| | Composition | |
|---|---|---|
| Nd | B | Fe |
| 31.6 | 1.2 | Bal |

TABLE 4

| | Film thickness (μm) | Magnetic characteristics | | |
|---|---|---|---|---|
| No. | | Br (T) | iHc (MA/m) | (BH) max (kJ/m³) |
| C4 | 1.0 | 0.76 | 1.16 | 105 |
| C5 | 1.5 | 0.75 | 1.24 | 103 |

INDUSTRIAL APPLICABILITY

According to the present invention, a thin film provided with an increased percentage content of a transition metal element in relation to a rare-earth element and obtained by layering a plurality of atomic layered units that comprise monoatomic layers of the rare-earth element and transition metal element produced by vapor-phase growth has an axis of easy magnetization in the layering direction and can be rendered anisotropic in the layering direction, and a heat treatment can be conducted at a temperature of 900 K or less, making it possible to provide an anisotropic thin-film rare-earth permanent magnet that has high magnetic characteristics, as is evident from the examples.

The invention claimed is:

1. An anisotropic thin-film rare-earth permanent magnet, comprising at least one atomic layered unit that includes:
    a plurality of monoatomic layers of a transition metal element directly disposed on each other and directly layered on a monoatomic layer of a rare-earth element which is directly layered on a substrate comprising a nonmagnetic material with a surface roughness of 1.0 μm or less; and
    one or more monoatomic layers of the rare-earth element directly layered on an uppermost monoatomic layer of the plurality of monoatomic layers of the transition metal element, wherein
    the at least one atomic layered unit has an axis of easy magnetization in the layering direction, and
    the anisotropic thin-film rare-earth permanent magnet has a coercive force of 0.55 MA/m or higher and a residual magnetic flux density of 1.02 T or higher.

2. The anisotropic thin-film rare-earth permanent magnet according to claim 1, wherein the substrate comprising a nonmagnetic material is a silicon wafer or a wafer having an $RB_2C_2$ (where R is a rare-earth element) cleavage plane.

3. The anisotropic thin-film rare-earth permanent magnet according to claim 1, wherein
    the rare-earth element is at least one element selected from Nd, Tb, and Dy; and
    the transition metal element is at least one element selected from Ti, V, Cr, Mn, Fe, Co, Ni, and Cu.

4. The anisotropic thin-film rare-earth permanent magnet according to claim 1, wherein a protective film is formed on the entire layered formation.

5. The anisotropic thin-film rare-earth permanent magnet according to claim 1, wherein the residual magnetic flux density is 1.38 T or lower.

6. The anisotropic thin-film rare-earth permanent magnet according to claim 5, wherein the substrate comprising a nonmagnetic material is a silicon wafer or a wafer having an $RB_2C_2$ (where R is a rare-earth element) cleavage plane.

7. The anisotropic thin-film rare-earth permanent magnet according to claim 5, wherein
    the rare-earth element is at least one element selected from Nd, Tb, and Dy; and
    the transition metal element is at least one element selected from Ti, V, Cr, Mn, Fe, Co, Ni, and Cu.

8. The anisotropic thin-film rare-earth permanent magnet according to claim 5, wherein a protective film is formed on the entire layered formation.

9. The anisotropic thin-film rare-earth permanent magnet according to claim 1, wherein the coercive force is 1.23 MA/m or lower.

10. The anisotropic thin-film rare-earth permanent magnet according to claim 9, wherein the substrate comprising a nonmagnetic material is a silicon wafer or a wafer having an $RB_2C_2$ (where R is a rare-earth element) cleavage plane.

11. The anisotropic thin-film rare-earth permanent magnet according to claim 9, wherein
    the rare-earth element is at least one element selected from Nd, Tb, and Dy; and
    the transition metal element is at least one element selected from Ti, V. Cr, Mn, Fe, Co, Ni, and Cu.

12. The anisotropic thin-film rare-earth permanent magnet according to claim 9, wherein a protective film is formed on the entire layered formation.

13. The anisotropic thin-film rare-earth permanent magnet according to claim 9, wherein the residual magnetic flux density is 1.38 T or lower.

14. The anisotropic thin-film rare-earth permanent magnet according to claim 13, wherein the substrate comprising a nonmagnetic material is a silicon wafer or a wafer having an $RB_2C_2$ (where R is a rare-earth element) cleavage plane.

15. The anisotropic thin-film rare-earth permanent magnet according to claim 13, wherein the rare-earth element is at least one element selected from Nd, Tb, and Dy; and the transition metal element is at least one element selected from Ti, V, Cr, Mn, Fe, Co, Ni, and Cu.

16. The anisotropic tin-film rare-earth permanent magnet according to claim 13, wherein a protective film is formed on the entire layered formation.

* * * * *

UNITED STATES PATENT AND TRADEMARK OFFICE
CERTIFICATE OF CORRECTION

PATENT NO. : 7,285,338 B2 Page 1 of 1
APPLICATION NO. : 10/343480
DATED : October 23, 2007
INVENTOR(S) : Osamu Yamashita et al.

It is certified that error appears in the above-identified patent and that said Letters Patent is hereby corrected as shown below:

Title Page, Item (86)

For the filing of '371 c' date, delete "May 21, 2003" and insert --May 20, 2003--

Signed and Sealed this

Eighteenth Day of December, 2007

JON W. DUDAS
*Director of the United States Patent and Trademark Office*